United States Patent [19]

Kohyama

[11] Patent Number: 5,563,085
[45] Date of Patent: Oct. 8, 1996

[54] METHOD OF MANUFACTURING A SEMICONDUCTOR DEVICE

[75] Inventor: Yusuke Kohyama, Yokosuka, Japan

[73] Assignee: Kabushiki Kaisha Toshiba, Kawasaki, Japan

[21] Appl. No.: 328,814

[22] Filed: Oct. 25, 1994

Related U.S. Application Data

[63] Continuation of Ser. No. 203,944, Mar. 1, 1994, Pat. No. 5,372,966.

[30] Foreign Application Priority Data

Mar. 1, 1993 [JP] Japan .................................. 5-039948

[51] Int. Cl.$^6$ .............................................. H01L 21/8242
[52] U.S. Cl. ................................................................ 437/52
[58] Field of Search ................................... 437/47, 48, 52, 437/60, 89, 162, 919; 257/301

[56] References Cited

U.S. PATENT DOCUMENTS

| | | | |
|---|---|---|---|
| 4,566,914 | 1/1986 | Hall | 437/89 |
| 4,578,142 | 3/1986 | Corboy, Jr. et al. | 437/89 |
| 4,728,623 | 3/1988 | Lu et al. | 437/52 |
| 4,873,205 | 10/1989 | Critchlow et al. | 437/52 |
| 4,916,524 | 4/1990 | Teng et al. | 257/301 |
| 4,927,779 | 3/1990 | Dhong et al. | 437/203 |
| 4,969,022 | 11/1990 | Nishimoto et al. | 257/301 |
| 4,988,637 | 1/1991 | Dhong et al. | 437/203 |
| 5,075,248 | 12/1991 | Yoon et al. | 437/48 |
| 5,102,819 | 4/1992 | Malsushita et al. | 437/48 |
| 5,302,542 | 4/1994 | Kishi et al. | 437/52 |

OTHER PUBLICATIONS

"Flanged Trench Capacitor Cell" IBM TDB vol. 30, No. 5, Oct. 1987 pp. 410–411.

Isolation Merged Stacked Dynamic Random–Access Memory Cell. IBM TDB vol. 31, No. 7 Dec. 1988 pp. 39–40.

Primary Examiner—Tom Thomas
Attorney, Agent, or Firm—Banner & Allegretti, Ltd.

[57] ABSTRACT

In formation of a DRAM, a silicon nitride film is used as a mask to simultaneously expose a semiconductor substrate serving as an active region where an MOSFET is formed and a portion of the periphery of a trench. Therefore, even if the alignment offset of a resist pattern occurs, an interval between adjacent memory cells does not change. The interval between the adjacent memory cells is constantly the same as that when no alignment offset of the resist patter occurs. That is, only an n-type diffusion layer of the memory cell formed at a position adjacent to the trench comes close to source and drain regions of the adjacent memory cell.

9 Claims, 12 Drawing Sheets

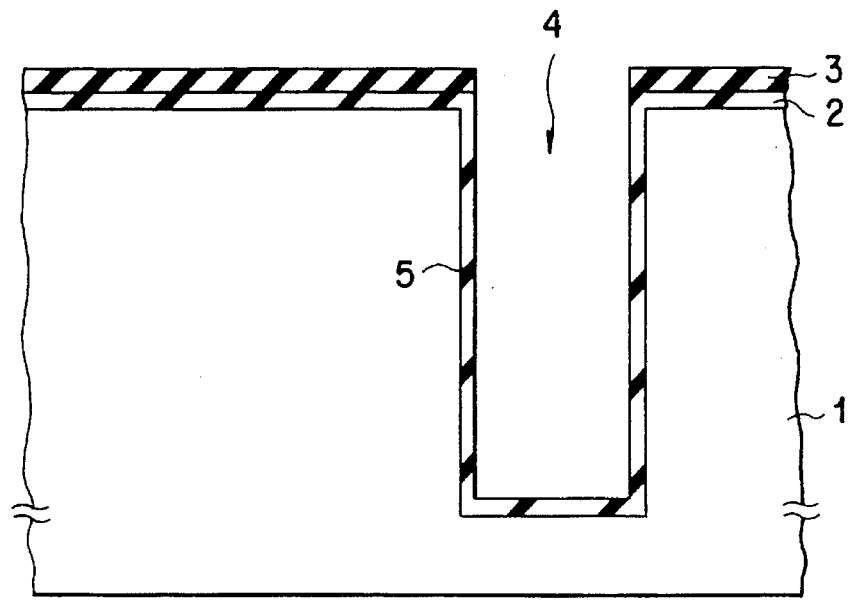
F I G. 1A
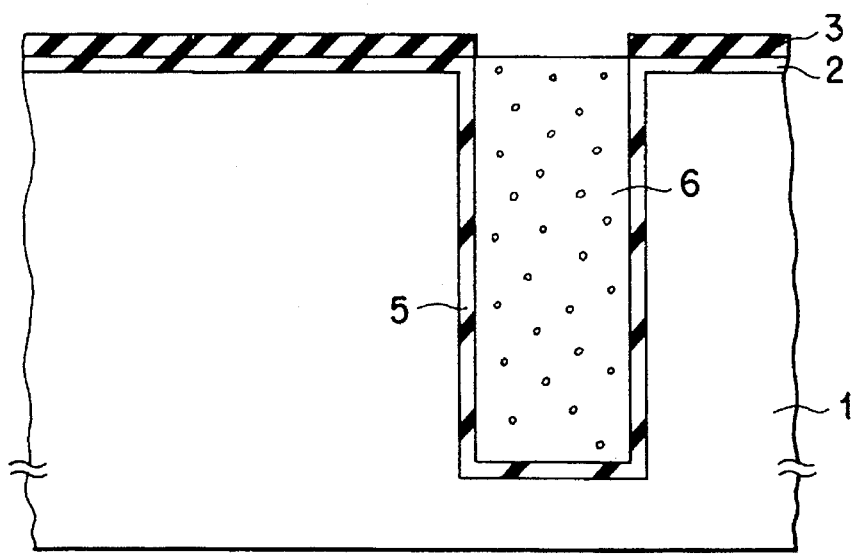
F I G. 1B

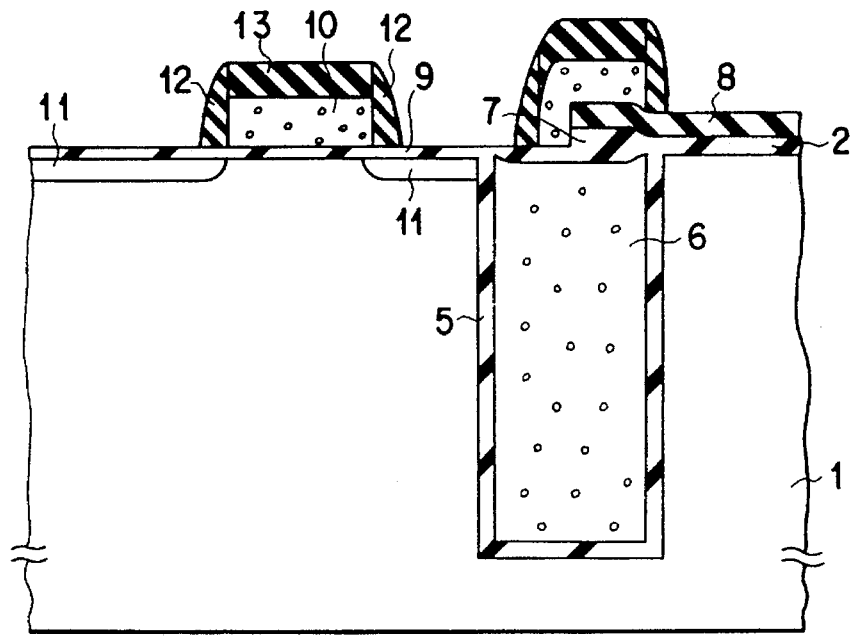
F I G. 1I
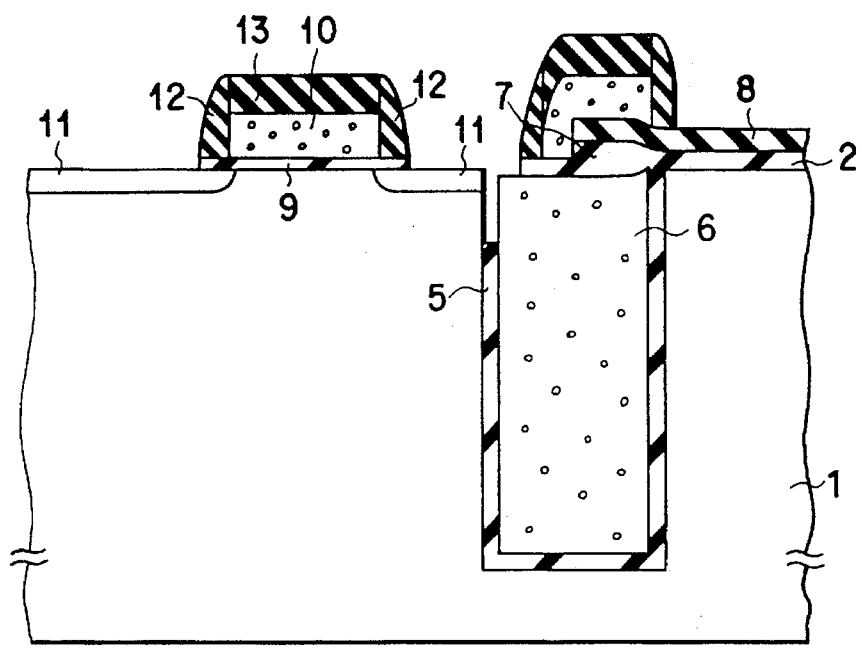
F I G. 1J

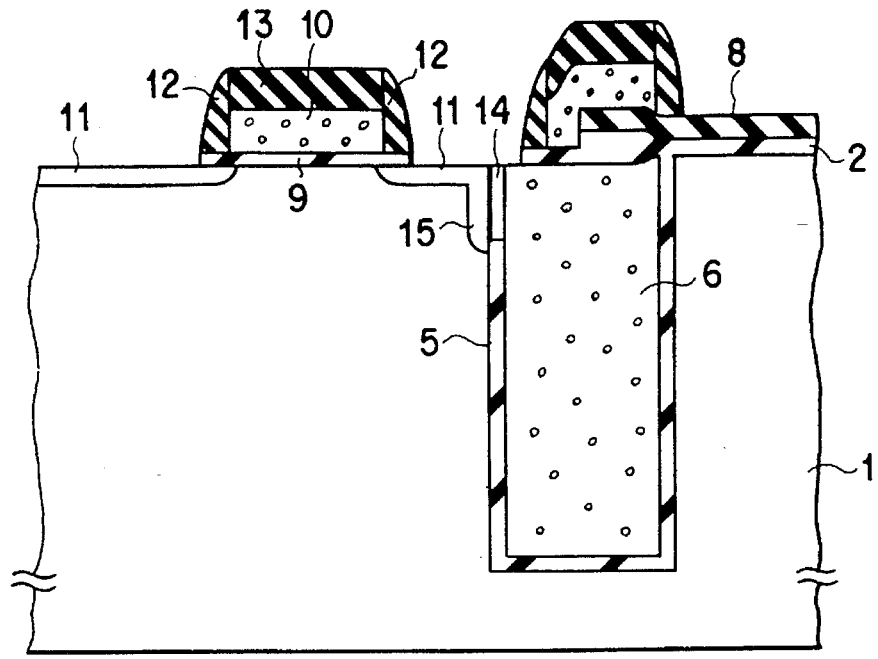
F I G. 1K
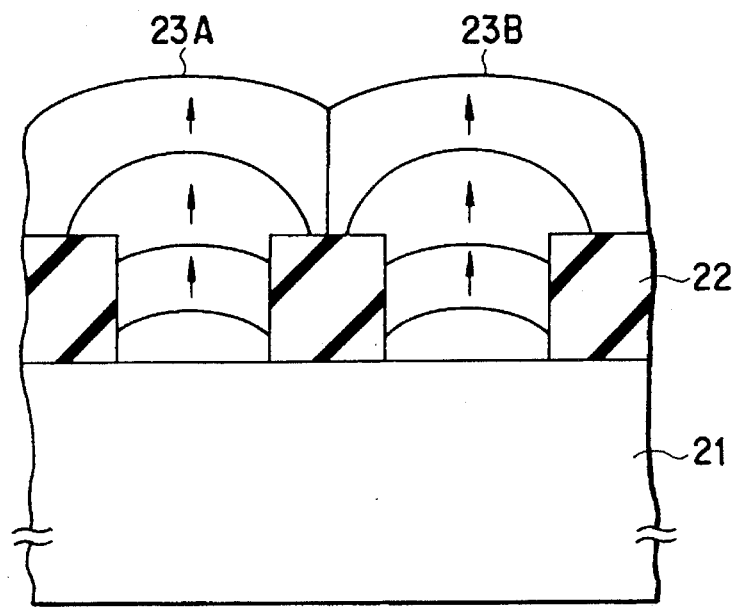
F I G. 2A

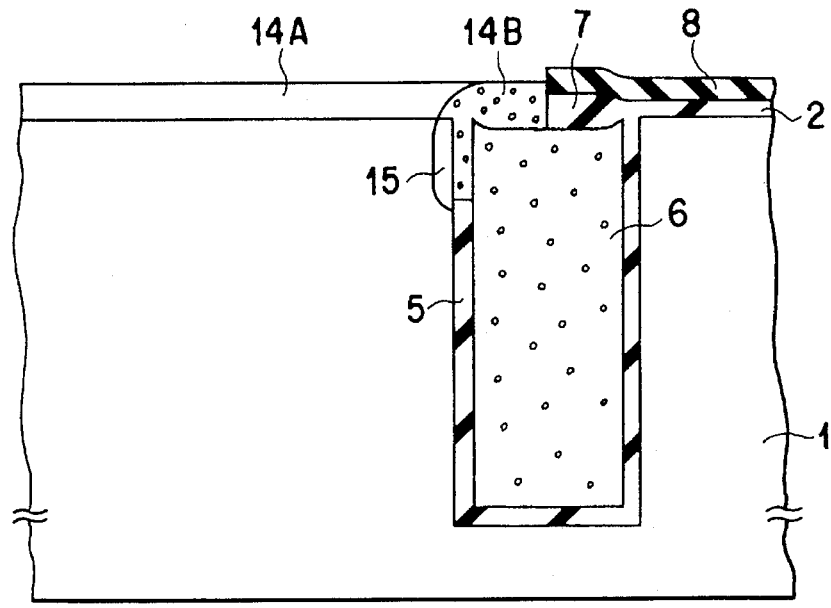
F I G. 4B
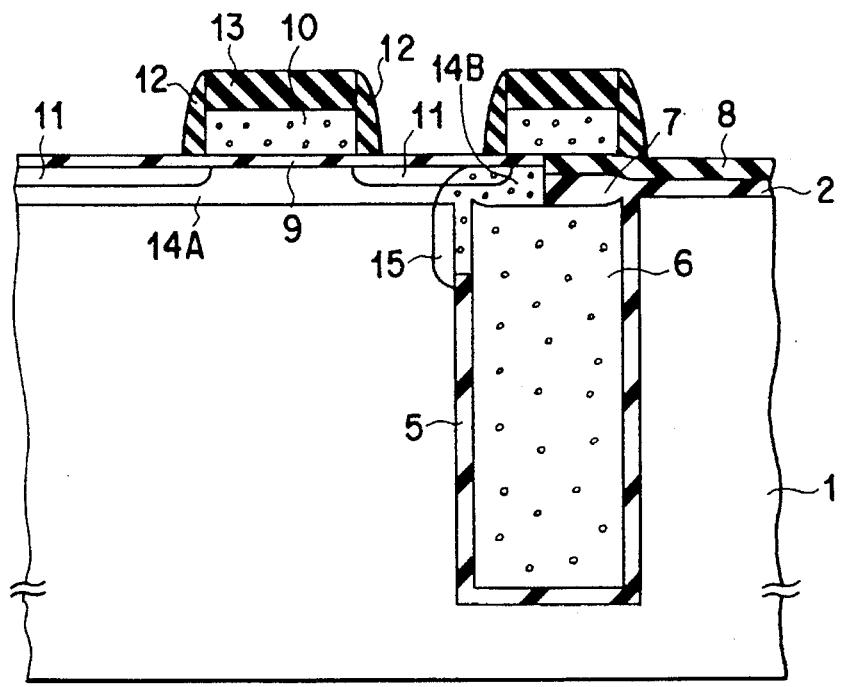
F I G. 4C

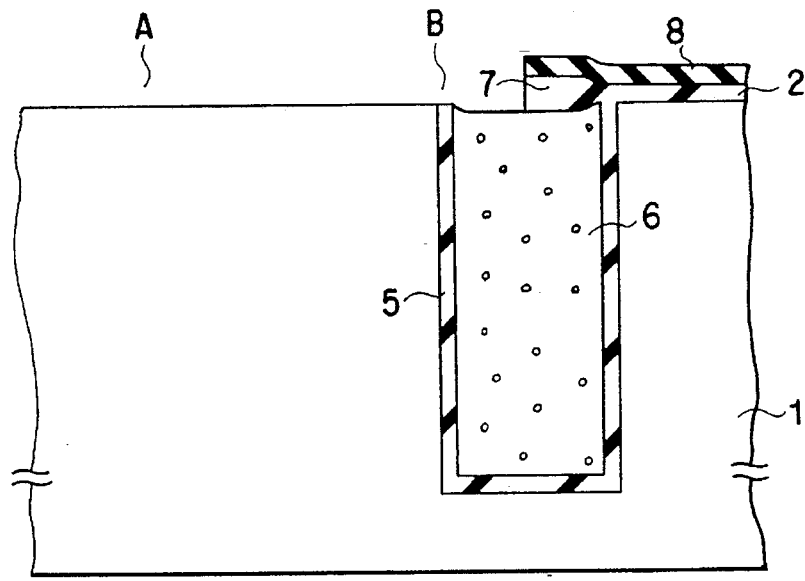
F I G. 5A
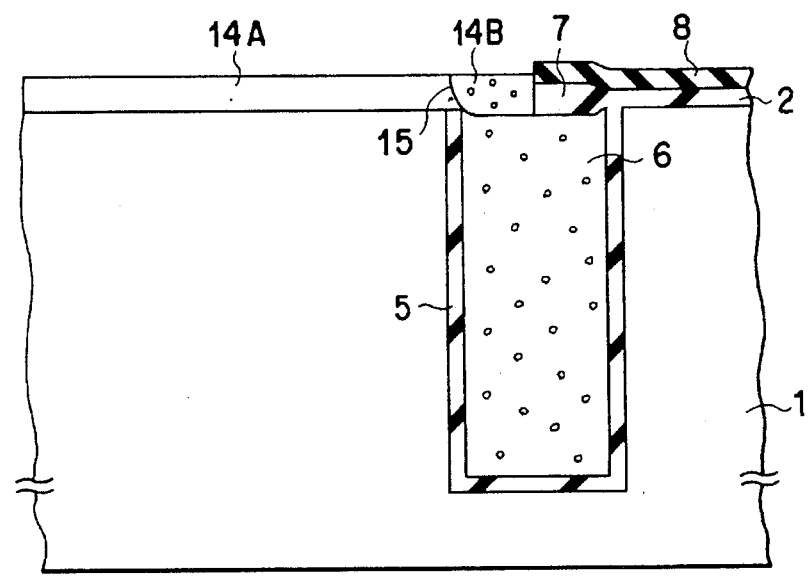
F I G. 5B

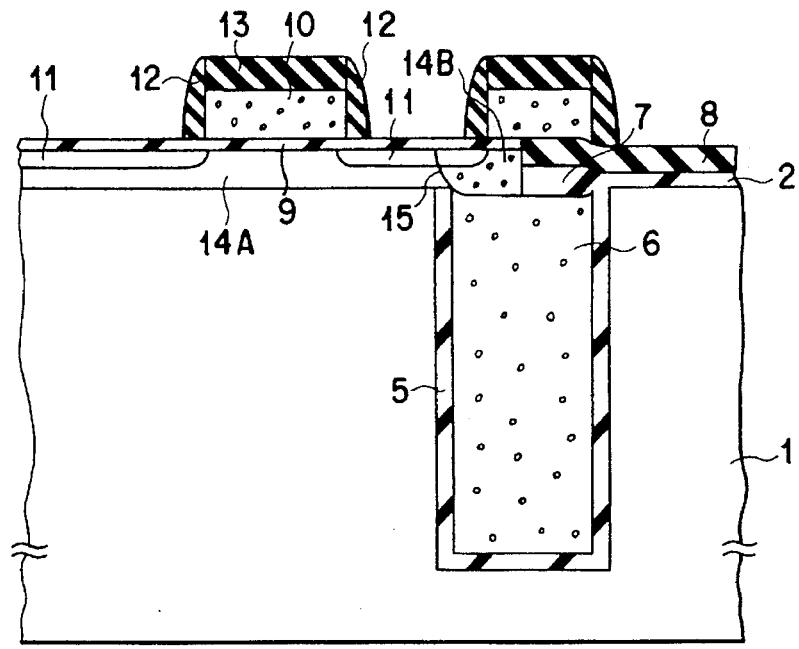
F I G. 5C

METHOD OF MANUFACTURING A SEMICONDUCTOR DEVICE

This application is a continuation of application Ser. No. 08/203,944, filed Mar. 1, 1994 now U.S. Pat. 5,372,966.

BACKGROUND OF THE INVENTION

1. Field of the Invention

The present invention relates to a method of making a semiconductor device and, more particularly, to a method of making a DRAM.

2. Description of the Related Art

A conventional method of making a DRAM will be described by exemplifying a semiconductor device disclosed in Jpn. Pat. Appln. KOKAI Publication No. 3-69185 (to be referred to as a reference hereinafter). FIG. 6A is a view showing part of the drawing in this reference. FIG. 6B is a view showing the semiconductor device in FIG. 6A when viewed from the top.

FIG. 6A shows the capacitor portion of a DRAM. A silicon oxide film 101 and a silicon nitride film 102 are formed over a semiconductor substrate 100. After patterning the silicon oxide film 101 and the silicon nitride film 102, the silicon nitride film 102 is used as a mask to form a trench 103 in the semiconductor substrate 100.

A capacitive insulating film 104 is formed in the inner wall and the bottom surface of the trench 103. The trench 103 is then filled with a polysilicon film 105. A resist film 106 having an etching resistance against the polysilicon film 105 is formed over the entire surface. The resist film 106 is lithographed and developed to form an opening 107 in a portion of the periphery of the trench 103. The resist film 106 having the opening 107 is used as a mask to etch part of the polysilicon film 105, thereby forming a connect region 109 (shown in FIG. 6B).

However, the following problem is posed in the above method. That is, for example, as shown in FIG. 6B, the interval between adjacent memory cells is set to a predetermined distance W. As shown in FIG. 7, if the alignment offset of the resist pattern occurs when the resist film 106 is lithographed and developed to form the opening 107 in the portion of the periphery of the trench 103, the alignment offset of a connect region 109', the interval between the source and drain regions 108 of the adjacent memory cells is set to W' smaller than the predetermined interval W between the adjacent memory cells. For this reason, punch-through occurs between the adjacent memory cells.

SUMMARY OF THE INVENTION

It is an object to provide a method of making a semiconductor device, in which even if the alignment offset of a resist pattern occurs when an opening is formed in a portion of the periphery of a trench, no punch-through occurs between adjacent memory cells.

According to one aspect of the present invention, there is provided a method of making a semiconductor memory device, which includes: preparing a semiconductor substrate of a first conductivity type, forming a first insulating film over the semiconductor substrate, forming a trench in the semiconductor substrate through the first insulating film, forming a second insulating film over an inner wall of the trench, filling the trench with a doped polysilicon layer, depositing a third insulating film over the first insulating film, using the third insulating film as a mask, removing the first insulating film to form an opening for defining both a transistor region and a connect region of the doped polysilicon layer at the same time, forming a transistor on the transistor region, exposing the connect region using the third insulating film as the mask, and forming a conductive layer so as to electrically connect one of source and drain regions of the transistor to the connect region.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIGS. 1A to 1K are views showing a method of making a semiconductor device according the first embodiment of the first invention FIG. 2A is a view showing a method of making a semiconductor device according to the first embodiment of the second invention;

FIGS. 4A to 4C are views showing a method of making a semiconductor device according to the first embodiment of the third invention FIGS. 5A to 5C are views showing a method of making a semiconductor device according to the second embodiment of the third invention;

DETAILED DESCRIPTION OF THE PREFERRED EMBODIMENTS

Figure 1C:
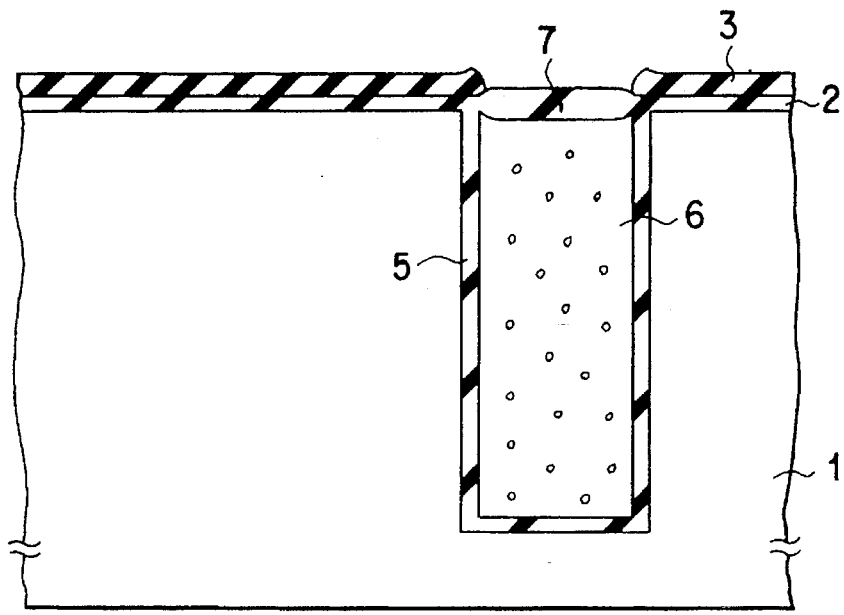

The present invention will be described below with reference to the accompanying drawings.

FIGS. 1A to 1K are views showing a method of making a substrate plate type DRAM according to the first embodiment of the first invention.

As shown in FIG. 1A, a silicon oxide film ($SiO_2$ film) 2 and a silicon nitride film (SiN) 3 are formed over a p-type semiconductor substrate 1. After patterning the silicon oxide film 2 and the silicon nitride film 3, the patterned silicon nitride film 3 is used as a mask to form a trench 4 in the substrate 1. A silicon oxide film 5 is formed on the inner wall and the bottom surface of the trench 4.

Figure 1D:
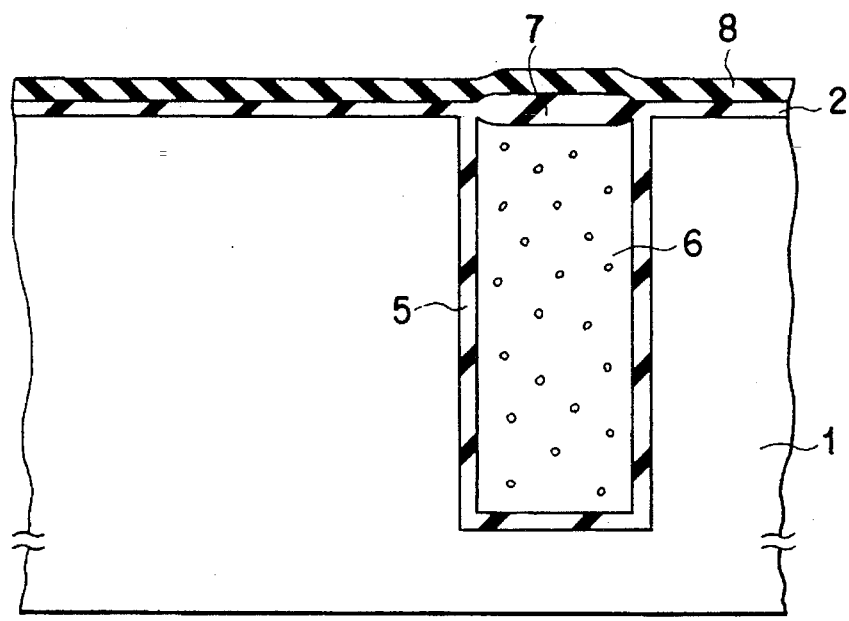

As shown in FIG. 1B, the trench 4 is filled with a n-type doped polysilicon layer 6. As shown in FIG. 1C, the patterned silicon nitride film 3 is used as a mask to oxidize the surface of the polysilicon layer 6, forming a silicon oxide film 7. As shown in FIG. 1D, the silicon nitride film 3 is removed, and a silicon nitride film 8 is then newly formed over the entire surface.

Figure 1E:
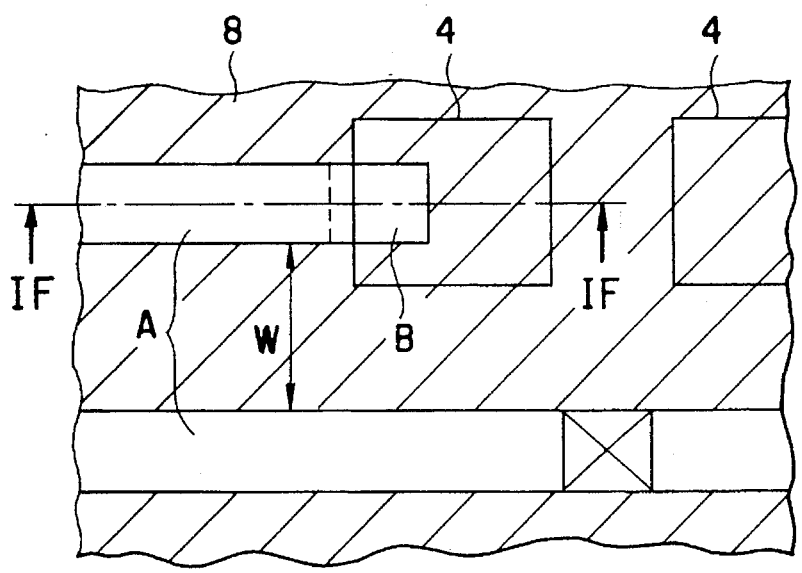
Figure 1F:
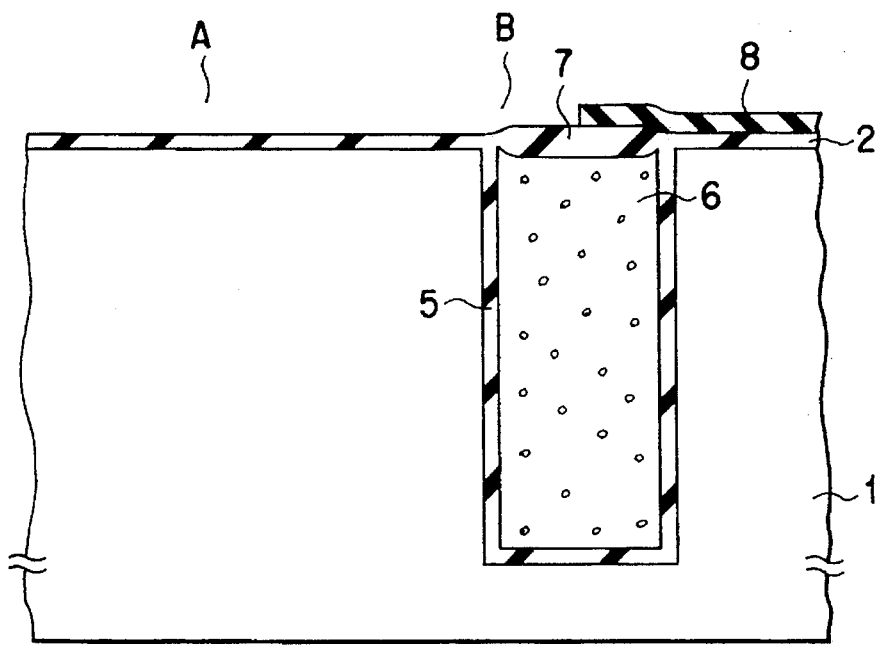

As shown in FIGS. 1E and 1F, the silicon nitride film 8 is etched to simultaneously expose the substrate 1 serving as an active region A where the MOSFET of a memory cell is formed, and a portion B of the periphery of the trench 4.

Figure 1G:
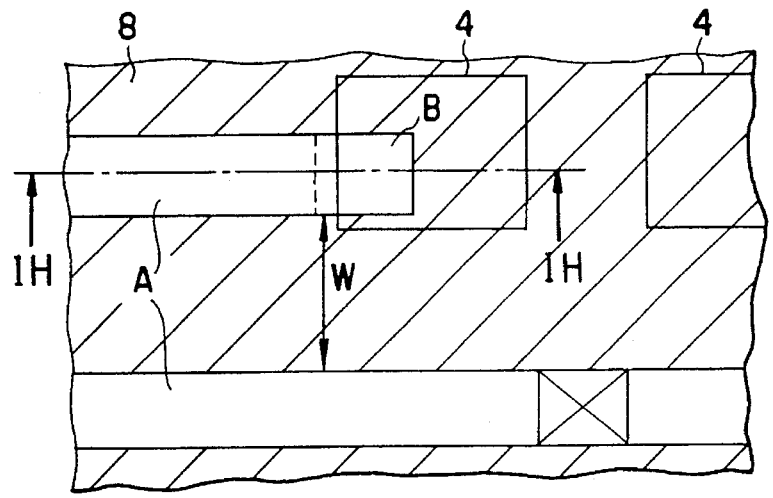

Therefore, even if the alignment offset of the resist pattern occurs, an interval W between adjacent memory cells does not change (see FIG. 1G). The interval W between the adjacent memory cells is constantly the same as that when no alignment offset of the resist pattern occurs.

Figure 1H:
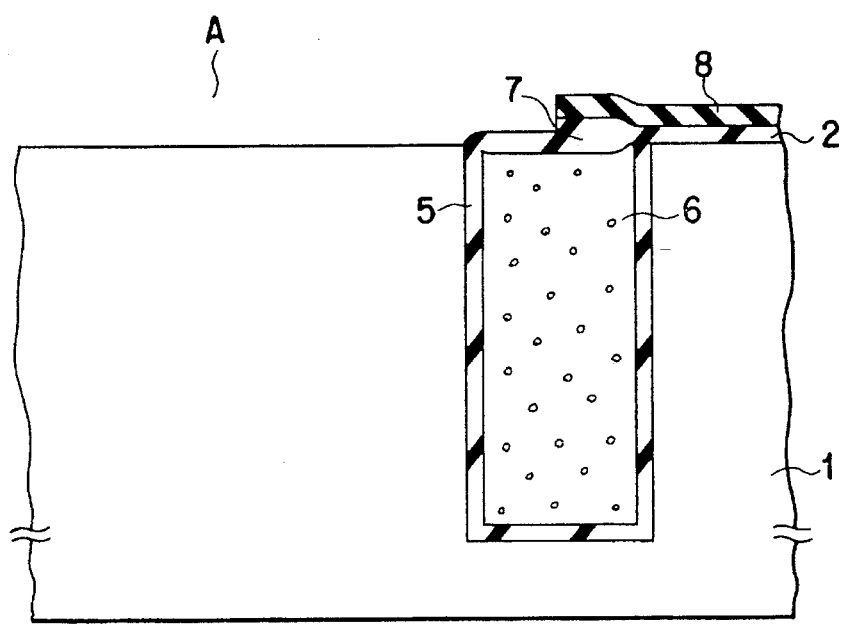

As shown in FIG. 1H, the silicon oxide film 2 on the active region A is removed. As shown in FIG. 1I, a gate insulating film (silicon oxide film) 9, a gate electrode 10, and source and drain regions 11 are then formed on the active region A, thereby completing the MOSFET of the memory cell. A spacer (e.g., a silicon nitride film) 12 and a silicon nitride film 13 are formed on the side wall and the surface of the gate electrode 10, respectively.

As shown in FIG. 1J, the spacer 12 and the silicon nitride films 8 and 13 are used as a mask to etch and remove the silicon oxide film 9 (except for a portion serving as the gate insulating film) and part of the silicon oxide film 5 on the inner wall of the trench 4, thereby forming a connect region between the capacitor and the MOSFET.

This etching is performed by using the spacer 12 and the silicon nitride films 8 and 13 as a mask. For this reason, the connect region between the capacitor and the MOSFET is self-aligned with the element isolation region and the active region.

As shown in FIG. 1K, a polysilicon film 14 is grown by using a CVD method on the source and drain regions 11 and the connect region between the capacitor and the MOSFET. The polysilicon film 14 is etch back such that the polysilicon film 14 is left on only the connect region. An n-type diffusion layer 15 is formed on part (etched portion) of the inner wall of the trench and the adjacent substrate 1. As a result, the capacitor constituted by the substrate (electrode) 1, the silicon oxide film 5 and the polysilicon layer 6 is connected to the MOSFET.

Finally, the gate electrode 10 of the MOSFET is connected to a word line (not shown), and a bit line and a metal wiring are formed by a known method, thereby completing a DRAM.

According to the above making method, when the silicon nitride film 8 is etched, the substrate 1 serving as the active region A and the portion B of the periphery of the trench 4 are simultaneously exposed. Therefore, even if the alignment offset of the resist pattern occurs, the interval w between the adjacent memory cells does not change. The interval W is constantly the same as that when no alignment offset of the resist pattern occurs. That is, the interval between the n-type diffusion layer 15 of a memory cell and the source and drain regions of the adjacent memory cell does not decrease even if the alignment offset of the resist pattern occurs.

FIG. 2A is a view showing a method of making a semiconductor device according to the first embodiment of the second invention. The present invention relates to a method of combining semiconductor layers each other.

An insulating film 22 is formed on a p-type substrate 21, and openings are formed in part of the insulating film 22. By using a selective epitaxy growth method (to be referred to as the SEG method hereinafter), a semiconductor layer 23A is then grown from one opening, and a semiconductor layer 23B is grown from another opening. The semiconductor layer 23A grown from one opening by using the p-type substrate 21 as a nucleus is combined with the semiconductor layer 23B grown from another opening by using the p-type substrate 21 as a nucleus.

According to the above making method, the semiconductor layers can be easily connected to each other. Although, in the above embodiment, the p-type semiconductor substrate 21 is used, an n-type semiconductor substrate may also be used.

Figure 2B:
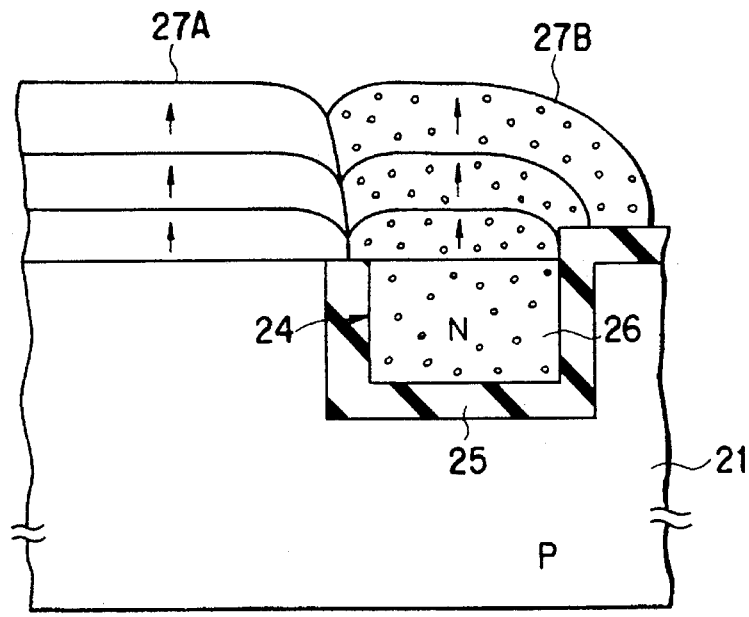
FIG. 2B is a view showing a method of making a semiconductor device according to the second embodiment of the second invention

FIG. 2B is a view showing a method of making a semiconductor device according to the second embodiment of the second invention.

A trench 24 is formed in a p-type substrate 21, and an insulating film 25 is formed on the inner wall and the bottom surface of the trench 24. The trench 24 is filled with an n-type polysilicon film 26. By using the SEG method, a semiconductor layer 27A is grown from the p-type substrate 21 and a semiconductor layer 27B is grown from the n-type polysilicon layer 26. The semiconductor layer 27A grown by using the p-type substrate 21 as a nucleus is combined with the semiconductor layer 27B grown by using the n-type polysilicon layer 26 as a nucleus.

According to the above making method, the semiconductor layer of the first conductivity type can be easily connected with the semiconductor layer of the second conductivity type.

The second invention can be applied to the first invention. More specifically, in the first embodiment of the first invention, the SEG method can be used when the source and drain regions 11, the capacitor of the MOSFET are connected.

Figure 3A:
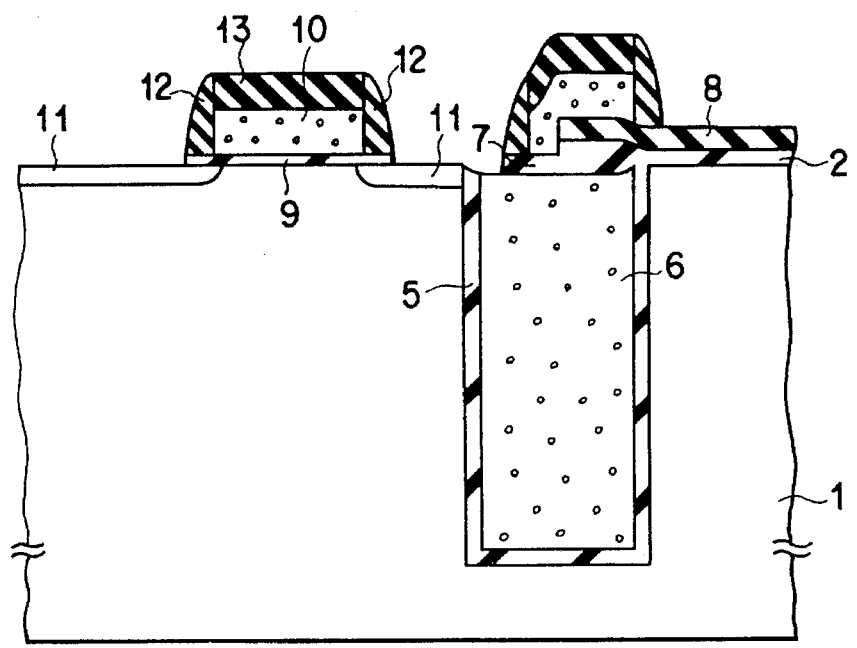
FIGS. 3A and 3B are views showing a method of making a semiconductor device according to the second embodiment of the first invention
Figure 3B:
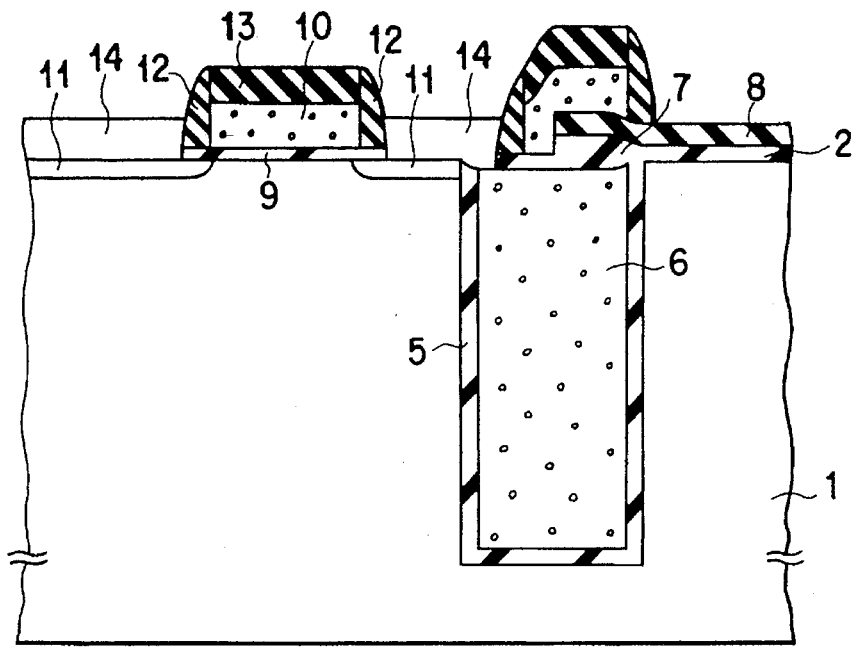

FIGS. 3A and 3B are views showing a method of making a substrate plate type DRAM according to the second embodiment of the first invention.

By using the same method as in the first embodiment of the first invention, the MOSFET of a memory cell, which is constituted by a gate insulating film 9, a gate electrode 10, and source and drain regions 11, is formed on an active region A. A spacer 12 and a silicon nitride film 13 are formed on the side wall and the surface of the gate electrode 10, respectively (see FIGS. 1A to 1I).

As shown in FIG. 3A, the spacer 12 and silicon nitride films 8 and 13 are used as a mask to etch and remove the silicon oxide film 9 (except for a portion serving as the gate insulating film), and part of silicon oxide films 5 and 7 on the trench 4, thereby forming a connect region between the capacitor and the MOSFET. This embodiment differs from the first embodiment of the first invention in that the silicon oxide film 5 on the inner wall of the trench 4 is not etched.

This etching is performed by using the spacer 12 and the silicon nitride films 8 and 13 as a mask. For this reason, the connect region between the capacitor and the MOSFET is self-aligned with the element isolation region and the active region.

As shown in FIG. 3B, a semiconductor film 14 is formed on the source and drain regions 11 and the connect region between the capacitor and the MOSFET. As a result, the capacitor constituted by the substrate (electrode) 1, the silicon oxide film 5, and the polysilicon layer 6 is connected to the MOSFET.

Finally, the gate electrode 10 of the MOSFET is connected to a word line, and a bit line and a metal wiring are formed by a known method, thereby completing a DRAM.

Also in the above making method, the same effect as in the first embodiment of the first invention can be obtained.

Figure 4A:
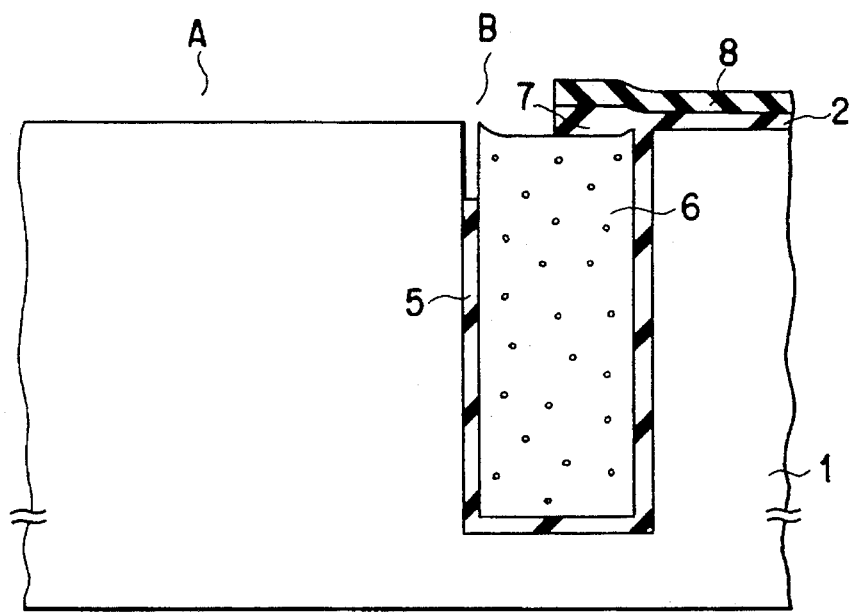
Figure 6A:
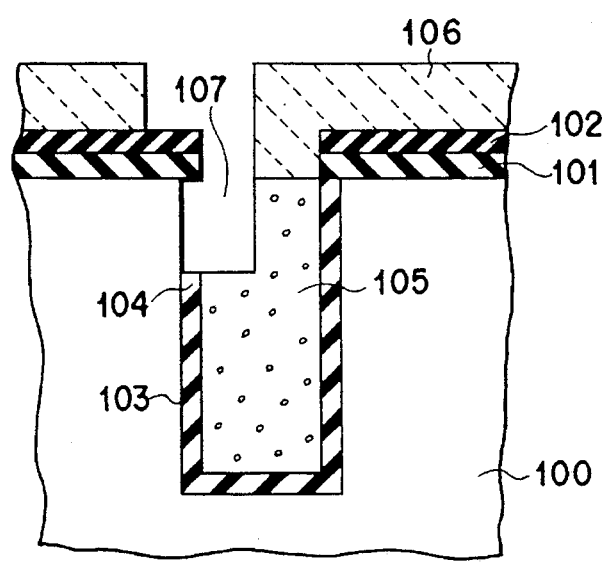
FIGS. 6A and 6B are views showing a conventional method of making a semiconductor device.
Figure 6B:
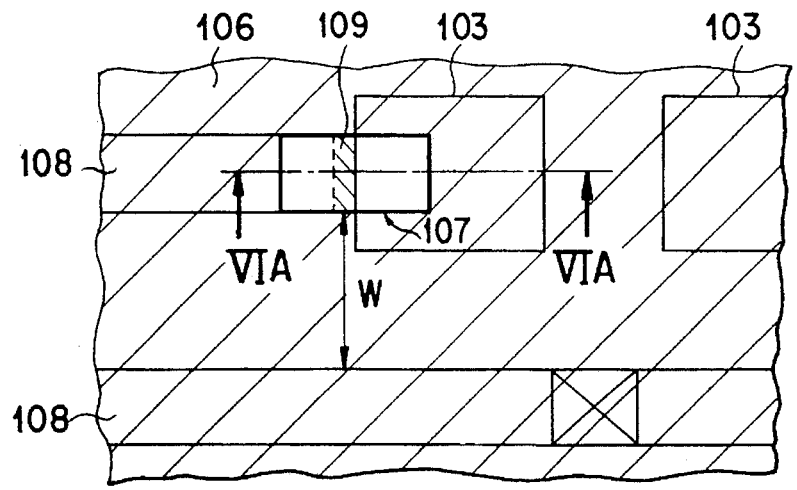
Figure 7:
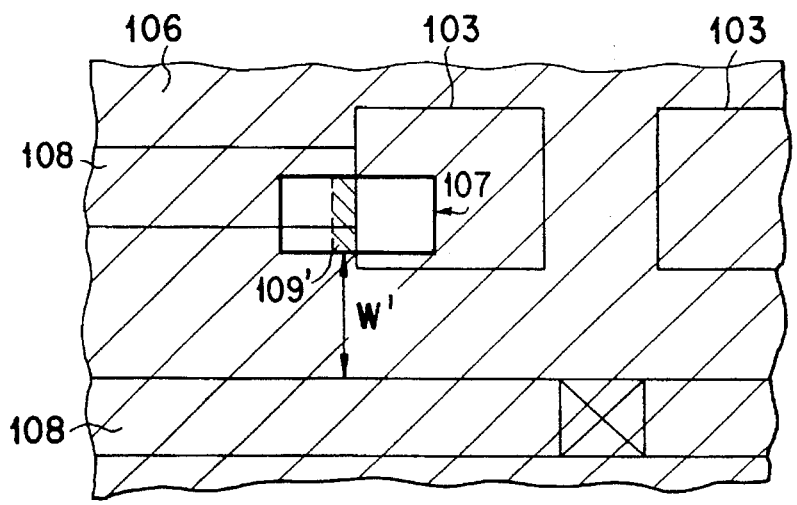
FIG. 7 is a view showing a problem posed in the conventional method of making a semiconductor device.

FIGS. 4A to 4C are views showing a method of making a substrate plate type. DRAM according to the first embodiment of the third invention.

By the same method as in the first embodiment of the first invention, a silicon nitride film 8 is etched to simultaneously expose a substrate 1 serving as an active region A and a portion B of the periphery of a trench 4 (see FIGS. 1A to 1G).

As in the first embodiment, in exposure of the active region A and the portion B of the periphery of the trench 4, an interval w between adjacent memory cells does not change even if the alignment offset of the resist pattern occurs. The interval W between the adjacent memory cells is constantly the same as that when no alignment of the resist patter occurs.

As shown in FIG. 4A, the silicon nitride film 8 is used as a mask to etch and remove a silicon oxide film 2 on the active region A, part of a silicon oxide film 7 on the trench, and part of a silicon oxide film 5 on the inner wall of the trench.

As shown in FIG. 4B, by using the SEG method, a single-crystal silicon film 14A is grown on the substrate (active region) 1, and a polysilicon film 14B is grown on the trench (connect region between the capacitor and the MOSFET). The single-crystal silicon film 14A is combined with the polysilicon film 14B.

Annealing is then performed to diffuse an n-type impurity contained in a polysilicon layer 6 in the trench into the substrate or the silicon films 14A and 14B at the peripheral portion of the trench. As a result, an n-type diffusion layer 15 is formed in the substrate 1. A capacitor is constituted by the substrate 1, the silicon oxide film 5, and the polysilicon layer 6.

As shown in FIG. 4C, a gate insulating film (silicon oxide film) 9, a gate electrode 10, and source and drain regions 11 are formed on the single-crystal silicon film 14A, thereby completing the MOSFET of a memory cell. A spacer (e.g., silicon nitride film) 12 and a silicon nitride film 13 are formed on the side wall and the surface of the gate electrode 10, respectively.

Finally, the gate electrode 10 of the MOSFET is connected to a word line (not shown), and a bit line and a metal wiring are formed by a known method, thereby completing a DRAM.

Also in the above making method, when the silicon nitride film 8 is etched, the substrate 1 serving as the active region A where the MOSFET of the memory cell is formed, and the portion B of the periphery of the trench 4 are simultaneously exposed. Therefore, even if the alignment offset of the resist pattern occurs, an interval W between adjacent memory cells does not change. The interval W is constantly the same as that when no alignment offset of the resist pattern occurs. That is, the interval between the n-type diffusion layer 15 of a memory cell and the source and drain regions of the adjacent memory cell does not decrease even if the alignment offset of the resist pattern occurs.

In this embodiment, the single-crystal silicon film 14A and the polysilicon film 14B are grown by the SEG method on the substrate (active region) 1 and the trench (connect region between the capacitor and the MOSFET), respectively, and the single-crystal silicon film 14A is combined with the polysilicon film 14B. Therefore, the MOSFET and the capacitor can be easily connected to each other.

FIGS. 5A to 5C are views showing a method of making a substrate plate type DRAM according to the second embodiment of the third invention.

By the same method as in the first embodiment of the first invention, a silicon nitride film 8 is etched to simultaneously exposure a substrate 1 serving as an active region A where the MOSFET of a memory cell is formed, and a portion B of the periphery of a trench 4 (see FIGS. 1A to 1G).

As in the first embodiment, in exposure of the active region A and the portion B of the periphery of the trench 4, even if the alignment offset of the resist pattern occurs, an interval W between adjacent memory cells does not change. The interval W between the adjacent memory cells is constantly the same as that when no alignment offset of the resist pattern occurs.

As shown in FIG. 5A, the silicon nitride film 8 is used as a mask to etch and remove a silicon oxide film 2 on the active region A and part of a silicon oxide film 7 on the trench. This embodiment differs from the first embodiment of the third invention in that a silicon oxide film 5 on the inner wall of the trench is not etched and removed.

As shown in FIG. 5B, by using the SEG method, a single-crystal silicon film 14A is grown on the substrate (active region) 1, and a polysilicon film 14B is grown on the trench (connect region between the capacitor and the MOSFET). The single-crystal silicon film 14A is combined with the polysilicon film 14B.

Annealing is then performed to diffuse an n-type impurity contained in a polysilicon layer 6 in the trench into the silicon films 14A and 14B on the trench. As a result, an n-type diffusion layer 15 is formed in the silicon films 14A and 14B on the trench. A capacitor is constituted by the substrate 1, the silicon oxide film 5, and the polysilicon layer 6.

As shown in FIG. 5C, a gate insulating film (silicon oxide film) 9, a gate electrode 10, and source and drain regions 11 are formed on the single-crystal silicon film 14A, thereby completing the MOSFET of a memory cell. A spacer (e.g., silicon nitride film) 12 and a silicon nitride film 13 are formed on the side wall and the surface of the gate electrode 10, respectively.

Finally, the gate electrode 10 of the MOSFET is connected to a word line (not shown), and a bit line and a metal wiring are formed by a known method, thereby completing a DRAM.

Also in the above method, the same effect as in the first embodiment of the third invention can be obtained.

In the first and third inventions, the substrate plate type DRAM has been exemplified. However, the present invention is not limited to this. For example, the present invention can be applied to a semiconductor device such as a stack trench or sheath plate type DRAM, in which an opening for connecting the MOSFET is formed in the inner wall portion of the trench where the capacitor is formed.

It is further understood by those skilled in the art that the foregoing description is only of the preferred embodiments and that various changes and modifications may be made in the invention without departing from the spirit and scope thereof.

What is claimed is:

1. A method of manufacturing a semiconductor device comprising the steps of:

forming a trench in a semiconductor substrate;

forming an insulating film on an inner wall and a bottom surface of said trench;

filling said trench with a first semiconductor layer containing an impurity;

removing a portion of said insulating film from an upper portion of said inner wall of said trench;

using selective epitaxial growth for growing a second semiconductor layer on said semiconductor substrate, including said upper portion of said inner wall of said trench, and said first semiconductor layer;

diffusing the impurity in said first semiconductor layer to form a diffusion layer in said second semiconductor layer; and forming a MOSFET having source and drain regions on said second semiconductor layer, one of said source and drain regions overlapping with said diffusion layer.

2. The method according to claim 1, wherein the conductivity type of said first semiconductor layer and the conductivity type of said source and drain regions of said MOSFET are the same.

3. The method according to claim 1, wherein the step of diffusing the impurity in said first semiconductor layer forms a diffusion layer in said second semiconductor layer and said semiconductor substrate adjacent to said first semiconductor layer at said upper portion of said trench.

4. A method of making a semiconductor memory device comprising the steps of:

forming a first insulating film over a semiconductor substrate;

forming a trench in said semiconductor substrate through said first insulating film;

forming a second insulating film over an inner wall and a bottom surface of said trench;

filling said trench with a first semiconductor layer doped with an impurity;

forming a third insulating film on said first semiconductor layer;

depositing a fourth insulating film over said first insulating film and said third insulating film;

using said fourth insulating film as a mask, removing a portion of said first insulating film and said third insulating film so as to expose a portion of said semiconductor substrate and said first semiconductor layer;

forming a second semiconductor layer on said exposed portion of said semiconductor substrate and said exposed portion of said first semiconductor layer;

diffusing the impurity from said first semiconductor layer into said second semiconductor layer to form a diffusion layer; and forming a transistor having source and drain regions on said second semiconductor layer, one of said source and drain regions of said transistor overlapping with said diffusion layer.

5. The method according to claim 4, wherein said first insulating film is silicon oxide, and said fourth insulating film is silicon nitride.

6. The method according to claim 4, wherein said first semiconductor layer is formed of polysilicon;

said second semiconductor layer is formed of single-crystal silicon and polysilicon; and said transistor is formed on the single-crystal silicon of said second semiconductor layer.

7. The method according to claim 4, wherein a portion of said second insulating film is removed simultaneously with said first and third insulating film, using said fourth insulating film as a mask.

8. The method according to claim 4, wherein said second semiconductor layer is formed using a selective epitaxial growth method.

9. The method according to claim 7, wherein the diffusing step diffuses the impurity from said first semiconductor layer into said second semiconductor layer and said semiconductor substrate to form a diffusion layer.

* * * * *